United States Patent
Lotfi et al.

(10) Patent No.: US 6,903,373 B1
(45) Date of Patent: Jun. 7, 2005

(54) SIC MOSFET FOR USE AS A POWER SWITCH AND A METHOD OF MANUFACTURING THE SAME

(75) Inventors: Ashraf W. Lotfi, Bridgewater, NJ (US); Jian Tan, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/448,856

(22) Filed: Nov. 23, 1999

(51) Int. Cl.[7] .................... H01L 31/0312; H01L 27/01
(52) U.S. Cl. ......................................... 257/77; 257/347
(58) Field of Search ................................... 257/77, 347

(56) References Cited

U.S. PATENT DOCUMENTS

| | | | |
|---|---|---|---|
| 4,441,146 A | | 4/1984 | Vinciarelli |
| 4,896,194 A | * | 1/1990 | Suzuki .......................... 357/16 |
| 4,983,538 A | * | 1/1991 | Gotou .......................... 437/100 |
| 5,135,885 A | | 8/1992 | Furukawa et al. |
| 5,184,199 A | | 2/1993 | Fujii et al. |
| 5,309,344 A | | 5/1994 | Smith |
| 5,326,991 A | * | 7/1994 | Takasu ........................ 257/77 |
| 5,331,533 A | | 7/1994 | Smith |
| 5,489,792 A | * | 2/1996 | Hu et al. ..................... 257/347 |
| 5,516,589 A | | 5/1996 | Nii |
| 5,528,482 A | | 6/1996 | Rozman |
| 5,574,295 A | | 11/1996 | Kurtz et al. |
| 5,589,695 A | * | 12/1996 | Malhi ........................... 257/77 |
| 5,672,889 A | * | 9/1997 | Brown .......................... 257/77 |
| 5,798,293 A | | 8/1998 | Harris |

FOREIGN PATENT DOCUMENTS

| | | |
|---|---|---|
| DE | 196 12 692 C1 | 8/1998 |
| WO | wo 93/24987 | 9/1993 |
| WO | WO 97/39485 | 3/1999 |

* cited by examiner

Primary Examiner—Ori Nadav

(57) ABSTRACT

A lateral metal-oxide semiconductor field effect transistor (MOSFET) formed over a substrate of a semiconductor wafer, a method of manufacturing the same and a semiconductor device incorporating the MOSFET or the method. In one embodiment, the MOSFET includes a silicon carbide layer located over or withing the substrate, a gate formed on the silicon carbide layer. The MOSFET further includes source and drain regions located in the silicon carbide layer and in contact with the gate, the silicon carbide layer increasing a breakdown voltage of the MOSFET.

9 Claims, 4 Drawing Sheets

SIC MOSFET FOR USE AS A POWER SWITCH AND A METHOD OF MANUFACTURING THE SAME

TECHNICAL FIELD OF THE INVENTION

The present invention is directed, in general, to semiconductor fabrication and, more specifically, to a silicon carbide metal oxide semiconductor field effect transistor (SiC MOSFET) having high breakdown voltage, a method of manufacturing the same and a semiconductor device incorporating the SiC MAOSFET or the method.

BACKGROUND OF THE INVENTION

A power converter is a power processing circuit that converts an input voltage waveform into a specified output voltage waveform. In many applications requiring a stable and well-regulated output, switched-mode power converters are frequently employed for an advantage. Switched-mode power converters generally include an inverter, a transformer having a primary winding coupled to the inverter, an output rectifier coupled to a secondary winding of the transformer, an output filter and a controller. The inverter generally includes a power switch, such as a field-effect transistor (FET), that converts an input voltage to a switched voltage that is applied across the transformer. The transformer may transform the voltage to another value and the output circuit generates a desired voltage at the output of the converter. The output filter typically includes an inductor and an output capacitor. The output capacitor smooths and filters the output voltage for delivery to a load.

In many power converter applications, the output voltage requirements and therefore the voltage handling requirements of the power switch, are large. In a conventional silicon semiconductor wafer, large voltage handling capability is difficult to achieve in a laterally constructed FET due to the inherently close proximity of the source and drain. This arrangement thereby causes lower than desired values of breakdown voltage for the device. This has often necessitated the use of a power switch called a vertical device metal oxide semiconductor FET (VDMOSFET). The VDMOSFET is constructed such that the drain is positioned on the bottom of the device, and the source is positioned on the top, with the gate vertically interposed between the drain and source. This vertical arrangement allows the VDMOSFET to achieve a larger breakdown voltage, and therefore, allows the VDMOSFET to accommodate a larger operating voltage while using conventional silicon semiconductor wafer technology.

Unfortunately, the VDMOSFET has a greater intrinsic on-resistance, which becomes important when the VDMOSFET is used as a switch, and also possesses a greater intrinsic capacitance. The greater on-resistance and capacitance are due, in part, to the increased separation of the source and drain and the added layers needed to obtain the larger breakdown and operating voltage capability. The greater on-resistance of the VDMOSFET increases the losses contributed by the VDMOSFET and may therefore reduce an overall efficiency of a power converter employing the VDMOSFET. Additionally, the added capacitance decreases switching speed and therefore may increase switching losses as well.

Another problem arises from the general trend of such electronic devices toward ever smaller device sizes and ever greater packing density. As the VDMOSFET's size continues to shrink and device packing density increases, the junction field effect transistor resistance of the vertical region between the two adjacent P wells also increase, thereby inhibiting the performance of the device even further. Thus, the VDMOSFET's use in such power converters may be substantially limited in the near future due to these physical limitations.

Accordingly, what is needed in the art is a MOSFET that provides an advantageous breakdown voltage characteristic while exhibiting a low on-resistance as a switch.

SUMMARY OF THE INVENTION

To address the above-discussed deficiencies of the prior art, the present invention provides a lateral metal-oxide semiconductor field effect transistor (MOSFET) formed over or within a substrate of a semiconductor wafer, a method of manufacturing the same and a semiconductor device incorporating the MOSFET or the method. In one embodiment, the MOSFET includes a silicon carbide layer that is located over or within, and preferably on, the substrate having a gate, which is formed on the silicon carbide layer. Source and drain regions are located in the silicon carbide layer and are laterally offset from the gate. In a preferred embodiment, the silicon carbide has a breakdown field greater than a breakdown field of silicon. For example, in one particularly advantageous embodiment, the breakdown voltage of the silicon carbide heavily doped p-n junction is at least about 10 volts.

The present invention therefore introduces the broad concept of employing silicon carbide in a lateral MOSFET device to increase a breakdown voltage of the MOSFET. The breakdown voltage is a critical parameter affecting a range of applications for the MOSFET device. The breakdown voltage is of particular importance in MOSFET devices that are employed as switches in power related applications, such as power converters. The lateral MOSFET device offers additional advantages, particularly in power application embodiments, since its on-resistance as a switch is inherently lower than vertically structured devices. The inherently lower on-resistance raises the efficiency of power converters and other switching devices employing the lateral MOSFET. Additionally, the ability to integrate silicon carbide lateral MOSFET devices and complementary metal oxide semiconductor (CMOS) devices onto the same semiconductor wafer allows power supplies to be located in close proximity to their load circuits.

The source and drain regions of the MOSFET are preferably doped with an N-type dopant and are preferably formed in a tub doped with a P-type dopant.

In another embodiment, the MOSFET further includes a buried oxide layer that may be formed in the substrate. The gate and substrate may be comprised of conventional materials, such as poly-silicon and silicon, respectfully. In those embodiments where the silicon carbide is formed on a silicon substrate, a 3C silicon carbide structure is formed. In yet another embodiment, the MOSFET is formed on a semiconductor wafer that includes a CMOS device, which, in certain embodiments, may form a drive controller for a power converter.

The MOSPET device as provided by the present invention may have various uses. One particular useful application is where the MOSFET is a power switch employed in a power train of a power converter.

Another aspect of the present invention provides a method of forming a lateral MOSFET over or within a substrate of a semiconductor wafer. In one embodiment, the method comprises forming a silicon carbide layer over the substrate, forming a gate on the silicon carbide layer, and forming source and drain regions in the silicon carbide layer laterally offset from the gate. The method may further include annealing the source and drain regions at about 1200° C.

As was the case with the device, the method may also comprise forming a buried oxide layer in the substrate. Moreover, forming source and drain regions may comprise implanting an N-type dopant into the silicon carbide layer, which may be doped with a P-type dopant.

In a preferred embodiment, the silicon carbide layer is formed on the substrate, which may be a silicon substrate. In such embodiments, a 3C silicon carbide layer may be formed.

In another embodiment, the method includes configuring the MOSFET as a power switch and integrating the MOSFET into a power converter.

In another aspect, the present invention provides a power converter that includes an isolation transformer, a primary side power switch coupled to a primary winding of the isolation transformer and a secondary side power switch coupled to a secondary winding of the isolation transformer. It should be understood that any switch employed in the power converter may include the a lateral MOSFET as provided by the present invention. The power converter further includes a drive circuit coupled to the secondary side power switch. The drive circuit preferably includes a CMOS device formed on a silicon substrate and has an operating voltage that is lower than the breakdown voltage of the MOSFET. An output inductor coupled to the secondary side power switch and an output capacitor coupled to the output inductor also form a part of the power converter.

The MOSFET incorporated into the power converter preferably includes a silicon carbide layer located over or within the substrate, a gate formed on the silicon carbide layer, and source and drain regions located in the silicon carbide layer and laterally offset from the gate. In such embodiments, the operating voltage may range from about 3 volts to 5 volts while the breakdown voltage may range from about 10 volts to 30 volts.

As with previous embodiments, the MOSFET may further include a buried oxide layer, which may be located in the substrate. Additionally, the source and drain regions may be doped with an N-type dopant, while the tub in which the source and drain regions are formed may be doped with a P-type dopant. In those embodiments where the silicon is formed on a silicon substrate, a 3C silicon carbide is formed.

In yet another aspect, the present invention provides a method of forming a power converter. In a preferred embodiment, the method includes forming an isolation transformer, forming a primary side power switch coupled to a primary winding of the isolation transformer and forming a secondary side power switch coupled to a secondary winding of the isolation transformer. It should be understood that any switch employed in the power converter may be a lateral MOSFET as provided by the present invention. The method further comprises forming a drive circuit coupled to the secondary side power switch, including a CMOS device formed on a silicon substrate and having an operating voltage, wherein the MOSFET has a breakdown voltage higher than the operating voltage of the CMOS device, forming an output inductor coupled to the secondary side power switch, and forming an output capacitor coupled to the output inductor, the secondary side power switch.

Another aspect of this particular method includes annealing the source and drain regions at about 1200° C. and may also include forming an oxide layer over the silicon carbide layer employing chemical vapor deposition. Preferably, the oxide layer is annealed at about 950° C.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
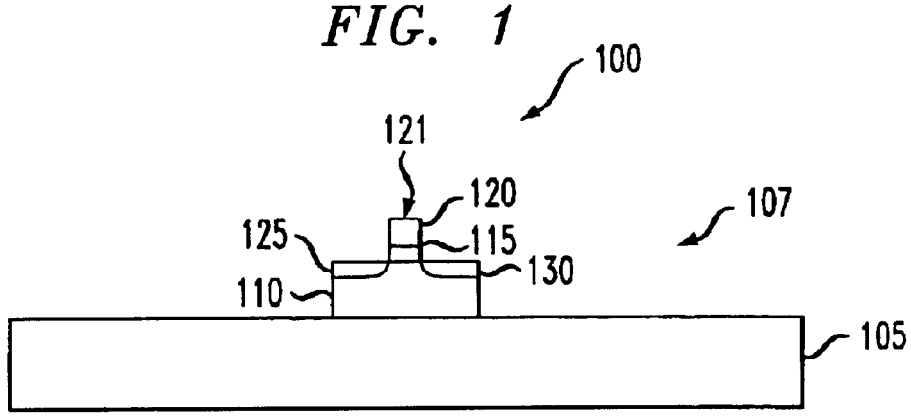
FIG. 1 illustrates a semiconductor wafer including an embodiment of a lateral MOSFET constructed in accordance with the principles of the present invention.

Referring initially to FIG. 1, illustrated is a semiconductor wafer 100 including an embodiment of a lateral MOSFET 107 constructed in accordance with the principles of the present invention. The semiconductor wafer 100 includes a substrate 105 and the lateral MOSFET 107, which is formed over the substrate 105. In the present embodiment, the lateral MOSFET 107 includes a silicon carbide layer 110 located over the substrate 105. The lateral MOSFET has a gate 121. The gate 121 is formed having a it gate layer 120 on a gate oxide layer 115, which is formed on the silicon carbide layer 110. Source and drain regions 125, 130 respectively, are conventionally formed in the silicon carbide layer 110. The source and drain regions 125, 130 are laterally offset from the gate as shown and are in contact with the gate 121.

In the illustrated embodiment, the substrate 105 and the silicon carbide layer 110 are doped with a P-type dopant, such as aluminum or boron. The gate structure 121 is preferably of conventional design and formed by conventional processes and may include a poly-silicon gate formed silicon dioxide gate oxide. The source and drain regions 125, 130 are conventionally implanted in the silicon carbide layer 110 as shown. The source and drain regions 125, 130 are preferably doped with an N-type dopant, such as nitrogen, arsenic or phosphorous. Of course, other materials may be used as the N-type dopants or the P-type dopants.

The present invention, therefore, employs silicon carbide in the lateral MOSFET 107 to increase the breakdown voltage of the lateral MOSFET 107. The breakdown voltage of the lateral MOSFET 107 is typically in the range of about 10 volts to 30 volts or higher as previously discussed. This range of breakdown voltage is determined by the doping parameters of the silicon carbide layer 110 and the size of the gate geometry being applied. The breakdown voltage of the lateral MOSFET 107 is typically chosen to be substantially above an operating voltage determined by other conventionally-formed devices, such as a CMOS that may also be employed in the semiconductor wafer 100.

The breakdown voltage is a critical parameter affecting a range of applications for the lateral MOSFET 107. An application of particular importance encompasses an embodiment of the present invention wherein the lateral MOSFET 107 is employed as a switch in a power related application, such as a power converter. The lateral MOSFET 107 offers an additional advantage along with higher breakdown voltage. The total on-resistance of the MOSFET 107, when used as a switch, is inherently lower than the total resistance associated with vertically structured devices or lateral devices on silicon with the same breakdown voltage. The total on-resistance of the MOSFET 107 is typically composed of just a channel resistance (often designated RcH) between the source 125 and the drain 130. An inherently lower on-resistance raises the efficiency of the lateral MOSFET 107 as a power switch compared to a typical vertically structured device and in other switching applications, as well.

In an alternate embodiment to be illustrated and discussed, the ability to integrate the lateral MOSFET 107 and CMOS devices into the semiconductor wafer 100 allows power supplies to be located in close proximity to their load circuits. This capability is extremely valuable, since it allows the diverse power requirements for groups of CMOS devices having different operating voltages to be accommodated on the semiconductor wafer 100. Separate power supplies for groups of CMOS devices having the same operating voltage allows the groups to be better isolated electrically thereby reducing and containing inherent noise interference on the semiconductor wafer 100.

Figure 2A:
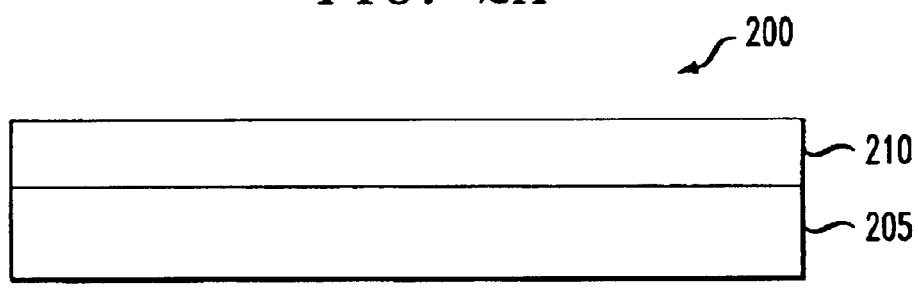
FIG. 2A illustrates a sectional view of a MOSFET covered by the present invention an intermediate stage of manufacture.

Turning now to FIGS. 2A through 2D, illustrated are sectional views of a MOSFET 200 covered by the present invention at various stages of manufacture. In FIG. 2A, illustrated is a substrate 205 and a silicon carbide layer 210. The silicon carbide layer 210 is formed on the substrate 205 by growing a cubic crystalline silicon carbide in the presence of a P-type dopant, such as aluminum or boron, thereby forming a tub for further implantation. In a preferred embodiment, the deposition of the silicon carbide layer 210 may be carried out in a quartz reaction tube at a temperature of about 900° C. with trimethoisilane as a source gas or using other conventional methods. As previously mentioned, the silicon carbide layer 110 provides distinct advantages over prior art materials, such as silicon, in that it provides a much higher breakdown field. Moreover, due to its configuration, the MOSFET is capable of behaving like an NMOS device, but is capable of holding off a much higher voltage than a typical NMOS device. These aspects allow the MOSFET to be easily integrated into a CMOS device with applications toward various technologies requiring high breakdown voltages, such as power converters.

Figure 2B:
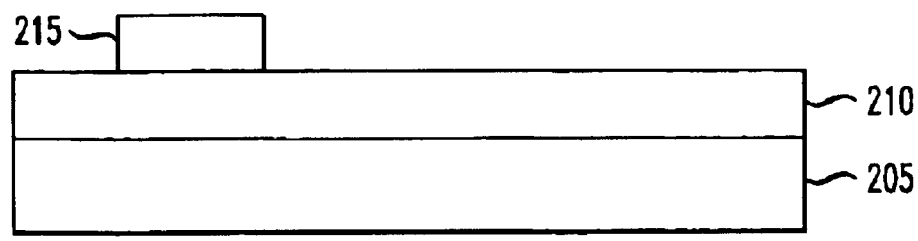
FIG. 2B illustrates a sectional view of the MOSFET of FIG. 2A at a subsequent intermediate stage of manufacture.
Figure 2C:
FIG. 2C illustrates a sectional view of the MOSFET of FIG. 2B at a subsequent intermediate stage of manufacture.

Following the formation of the silicon carbide layer 210, a photoresist layer 215 is then conventionally deposited on the silicon carbide layer 210 and patterned as show in FIG. 2B. FIG. 2C illustrates the MOSFET 200 wherein an unwanted portion of the silicon carbide layer 210 has been conventionally etched away and the photoresist layer 215 has been removed, thereby defining the area for the silicon carbide lateral MOSFET.

Figure 2D:
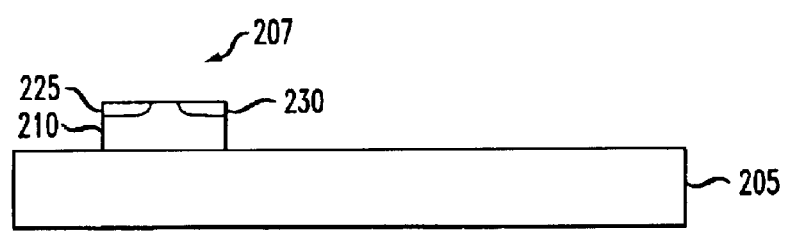
FIG. 2D illustrates a sectional view of the MOSFET of FIG. 2C at a subsequent intermediate stage of manufacture.

FIG. 2D illustrates the MOSFET 200 wherein a source 225 and a drain 230 are formed by implanting an N-type dopant into the silicon carbide layer 210. The N-type dopant is preferably phosphorous. Of course, nitrogen or another N-type dopant may be used as appropriate. The source 225 and the drain 230 regions are then annealed at about 1200° C. to activate the dopant. A silicon carbide base is thus provided on which the lateral MOSFET 107 that is suitable for use in devices requiring high breakdown voltages is subsequently formed.

Figure 2E:
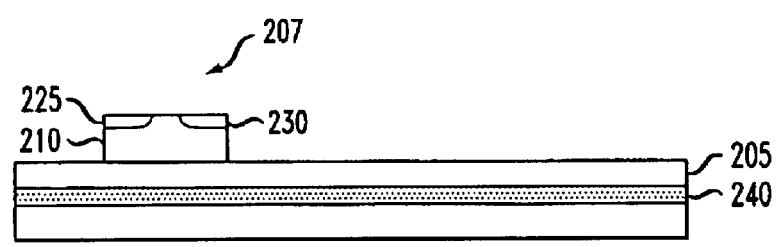
FIG. 2E illustrates a sectional view of another embodiment of the MOSFET as covered by the present invention.

FIG. 2E illustrates yet another embodiment, in which the MOSFET device 200 may be formed over a substrate having an insulator layer 240 formed therein, which is typically known as a buried oxide layer or a silicon-on-insulator. The insulator layer 240 is conventionally formed prior to the formation of the silicon carbide layer 210. The insulator layer 240 provides the advantage of reducing the overall parasitic capacitance that exists in integrated circuit devices.

Figure 2F:
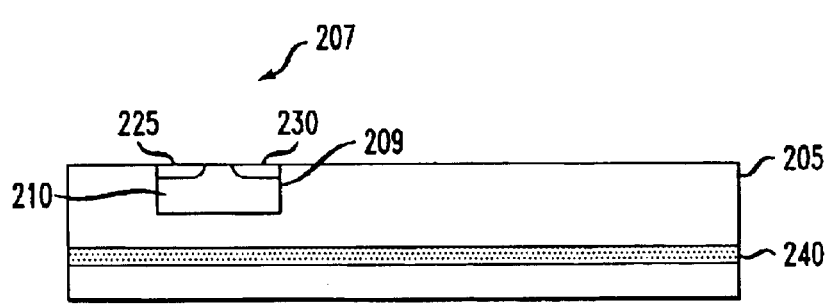
FIG. 2F illustrates a sectional view of another embodiment of the MOSFET as covered by the present invention.

FIG. 2F illustrates still another embodiment, in which the MOSFET device 200 may be formed within a substrate 205 having an insulator layer 240 formed therein, which was discussed in FIG. 2E. In such embodiments, a silicon trench 209 is conventionally formed in the substrate 205 prior to the formation of the silicon carbide layer 210. The silicon carbide layer 210 is then deposited in the silicon trench 209. Of course, another embodiment of the present invention may form the silicon trench 209 and the silicon carbide layer 210 within a substrate that does not have the insulator layer 240. Following the formation of the silicon carbide layer 210, a gate is formed on the silicon carbide layer 210 in the manner discussed herein for other embodiments.

Figure 3A:
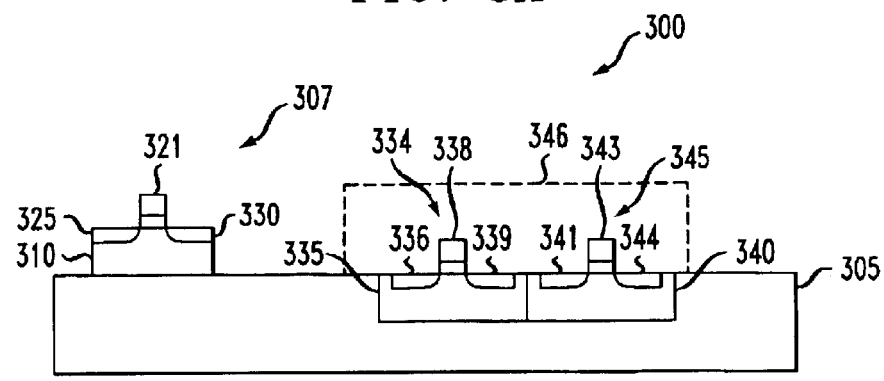
FIG. 3A illustrates an embodiment of a semiconductor wafer showing an integrated structure employing a silicon carbide lateral MOSFET and CMOS devices constructed in accordance with the principles of the present invention.

Turning now to FIG. 3A, illustrated is an embodiment of a semiconductor wafer showing an integrated structure employing a silicon carbide lateral MOSFET 307 and silicon CMOS devices 334, 345 constructed in accordance with the principles of the present invention. In this particular embodiment, the semiconductor wafer 300 includes a P-type doped silicon substrate 305 having first and second CMOS devices 334, 345 and a silicon carbide lateral MOSFET 307 as provided by the present invention formed thereon. The first CMOS device 334 is a PMOS transistor, and the second CMOS device 345 is an NMOS transistor, both of which are of conventional design and formed by conventional processes. As such, the first CMOS device 334 includes an N-doped tub region 335, a gate 338 and P-doped source and drain regions 336, 339 in contact with the gate 338. The second CMOS device 345 includes a P-doped tub region 340, a gate 343 and N-doped source and drain regions 341, 344 in contact with the gate 343. In this particular embodiment, the silicon carbide lateral MOSFET 307, includes a silicon carbide layer 310 containing a P-type dopant, a gate 321 and N-doped source and drain regions 325, 330 in contact with the gate 321. The gates 338, 343 and 321 are poly-silicon formed over a gate oxide such as silicon dioxide.

In this particular configuration, the lateral MOSFET 307 may have a breakdown voltage of about 10 volts to 30 volts, or higher, that is substantially higher than the operating voltage of about 3 volts to 5 volts for the first and second CMOS devices 334, 345. In the illustrated embodiment, the lateral MOSFET 307 may be employed as a power switch in a power converter. This aspect of the present invention is later discussed in more detail.

Figure 3B:
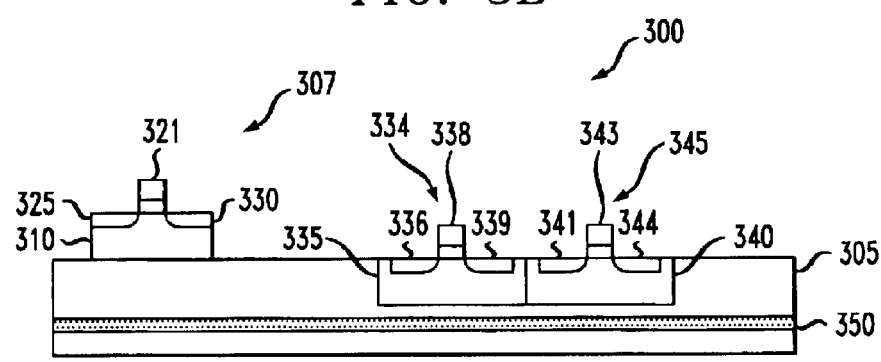
FIG. 3B illustrates another embodiment of a semiconductor wafer showing an integrated structure employing a silicon carbide lateral MOSFET and CMOS devices constructed in accordance with the principles of the present invention and having an insulator incorporated therein.

A method for constructing the semiconductor wafer 300 incorporates the figures as depicted in FIGS. 2A through 2D to construct the silicon carbide lateral MOSFET 307, up to the silicon carbide layer gate level, which is later defined. Once the silicon carbide layer 310 has been constructed, the first and second CMOS devices 334, 345 are then conventionally constructed on the substrate 305 up to the ohmic contacts, which are later defined. Following the formation of the CMOS devices 334, 345, a plasma enhanced tetraethyl orthosilciate oxide (PETEOS) layer 346 is conventionally deposited over the CMOS devices 334, 345 to isolate them from the MOSFET 307 gate oxide and gate formation processes. A MOSFET 307 gate oxide layer is first deposited followed by a 950° C. re-ox anneal. Then, a MOSFET 307 gate layer, such as polysilicon is then deposited over the gate oxide layer. These layers are then conventionally patterned and etched to form a gate oxide layer 315 and a gate 320 as shown in FIG. 3A. Metal ohmic contacts, which are not shown, are then formed for the lateral MOSFET 307 and annealed in argon at about 900° C., which are followed by the formation of CMOS device ohmic contacts that are annealed at about 450° C. FIG. 3B simply illustrates how the previously discussed insulator layer 350 might appear in one embodiment where the MOSFET device 307 is integrated into a CMOS circuit.

Figure 3C:
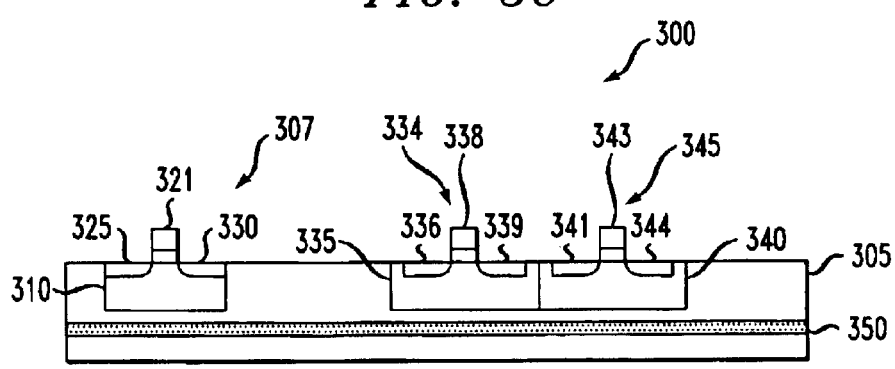
FIG. 3C illustrates an embodiment of the invention wherein the silicon carbide tub of FIG. 3B is located within a trench in the conductive substrate.

Turning briefly to FIG. 3C, illustrated is an embodiment of the invention wherein the silicon carbide tub 310 of FIG. 3B is located within a trench in the conductive substrate 305. In this embodiment, a tub 335, 340 of the CMOS device comprises a material different from the silicon carbide tub 310.

Figure 4:
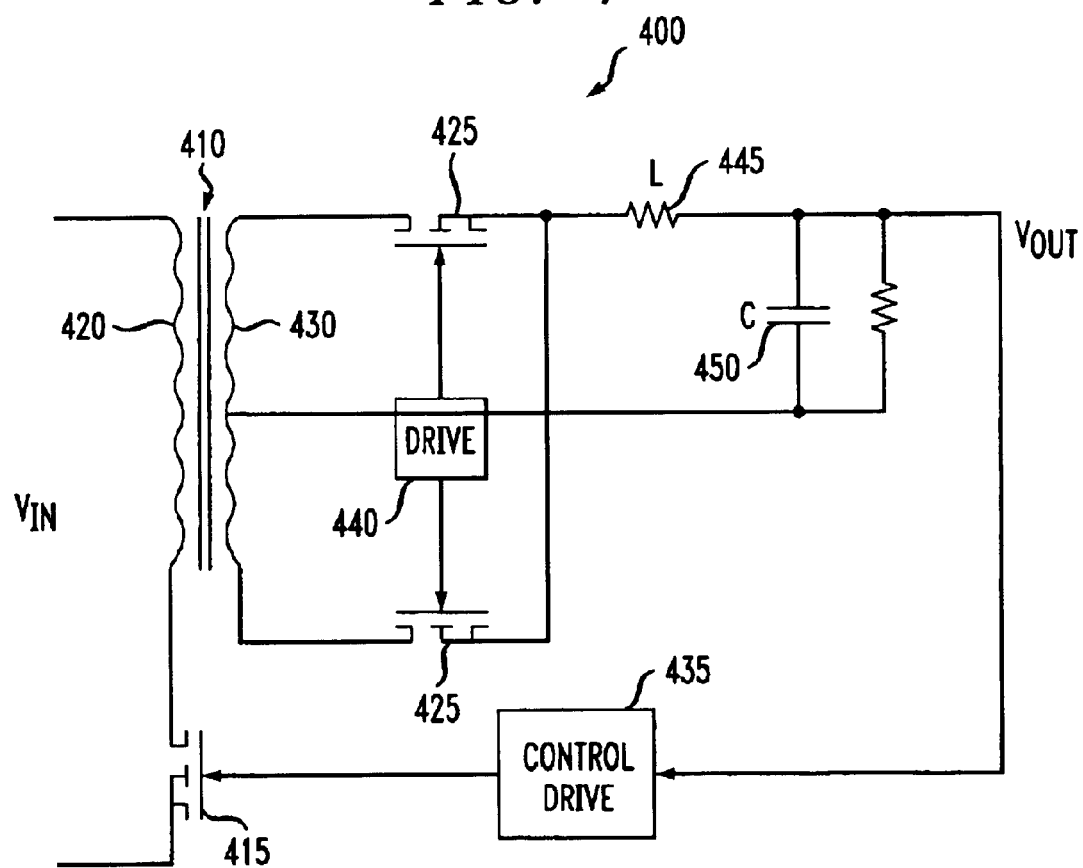
FIG. 4 illustrates a schematic diagram of a power converter into which the previously discussed MOSFET and CMOS devices may be incorporated.

Turning now to FIG. 4, there is illustrated a schematic diagram of a power converter 400 into which the previously discussed MOSFET and CMOS devices may be incorporated. In the illustrated embodiment, the power converter 400 includes an isolation transformer 410, a primary side power switch 415 coupled to a primary winding 420 of the isolation transformer 410. The power converter 400 further includes a secondary side power switch 425 that is coupled to a secondary winding 430 of the isolation transformer 410. It should be understood that any of the switches employed in the power converter 400 may include the MOSFET covered by the present invention, which has been described above.

The power converter 400, in a preferred embodiment, further includes a primary side control drive circuit 435 coupled to the primary side power switch 415 and a secondary drive circuit 440 coupled to the secondary side power switch 425. In a preferred embodiment, either or both of the drive circuits 435, 440 may include a CMOS device, which is preferably formed on the same silicon substrate as the MOSFET. The CMOS device preferably has an operating voltage that is lower than a breakdown voltage of the MOSFET. As discussed above, the breakdown voltage of the MOSFET is preferably substantially higher than the operating voltage of the CMOS device. The power converter 400 further includes an output inductor 445 coupled to the secondary side power switch 425 and an output capacitor 450 coupled to the output inductor 440.

Those skilled in the art should understand that the previously described embodiment of the power converter is submitted for illustrative purposes only and other power converter topologies such as half bridge, full bridge, flyback, and boost converter topologies employing discrete or integrated magnetics are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa.

Although the present invention has been described in detail, those skilled in the art should understand that they can make various changes, substitutions and alterations herein without departing from the spirit and scope of the invention in its broadest form.

What is claimed is:

1. A semiconductor device, comprising:
    a lateral metal-oxide semiconductor field effect transistor (MOSFET), including:
        a silicon carbide tub located within a trench formed in a conductive substrate;
        a gate formed on the silicon carbide tub; and
        source and drain regions located in the silicon carbide tub and laterally offset from the gate; and
    a complimentary metal-oxide semiconductor (CMOS) device formed on the conductive substrate, the CMOS device having a tub comprising a material different from that of the silicon carbide tub.

2. The semiconductor device as recited in claim 1 wherein the MOSFET has a breakdown voltage greater than an operating voltage of the CMOS device.

3. The semiconductor device as recited in claim 1 wherein the MOSFET has a breakdown voltage of at least about 10 volts and the CMOS device has a breakdown voltage between about 3 volts and 5 volts.

4. The semiconductor device as recited in claim 1 wherein the semiconductor device is a power converter and the MOSFET is a power switch for the power converter.

5. The semiconductor device as recited in claim 1 wherein the silicon carbide tub is located over the conductive substrate.

6. The semiconductor device as recited in claim 1 wherein the material is doped silicon, wherein the silicon is doped with a p-type dopant or an n-type dopant.

7. The semiconductor device as recited in claim 1 wherein the source and drain regions are doped with a p-type dopant or an n-type dopant.

8. The semiconductor device as recited in claim 1 further comprising a buried oxide layer formed in the conductive substrate.

9. The semiconductor device as recited in claim 1 wherein the conductive substrate comprises silicon and wherein the silicon carbide tub comprises a 3C silicon carbide.

* * * * *